(12) United States Patent
Ikushima

(10) Patent No.: US 8,703,601 B2
(45) Date of Patent: Apr. 22, 2014

(54) METHOD FOR APPLYING LIQUID MATERIAL, APPLICATION DEVICE AND PROGRAM

(75) Inventor: Kazumasa Ikushima, Mitaka (JP)

(73) Assignee: Musashi Engineering, Inc., Tokyo (JP)

( * ) Notice: Subject to any disclaimer, the term of this patent is extended or adjusted under 35 U.S.C. 154(b) by 80 days.

(21) Appl. No.: 13/389,895

(22) PCT Filed: Aug. 6, 2010

(86) PCT No.: PCT/JP2010/063346
§ 371 (c)(1),
(2), (4) Date: Apr. 18, 2012

(87) PCT Pub. No.: WO2011/018988
PCT Pub. Date: Feb. 17, 2011

(65) Prior Publication Data
US 2012/0313276 A1    Dec. 13, 2012

(30) Foreign Application Priority Data
Aug. 11, 2009 (JP) .................................. 2009-186349

(51) Int. Cl.
*H01L 21/44* (2006.01)
(52) U.S. Cl.
USPC .......................................... 438/613; 264/263
(58) Field of Classification Search
USPC .................................. 257/262, 263; 438/613
See application file for complete search history.

(56) References Cited

U.S. PATENT DOCUMENTS

| 5,686,763 A | 11/1997 | Tokuno et al. |
| 6,011,312 A * | 1/2000 | Nakazawa et al. ............ 257/778 |
| 6,066,509 A | 5/2000 | Akram et al. |
| 7,015,592 B2 * | 3/2006 | Starkston et al. ............. 257/787 |

(Continued)

FOREIGN PATENT DOCUMENTS

| JP | 10-50769 A | 2/1998 |
| JP | 2007-194403 A | 8/2007 |

(Continued)

OTHER PUBLICATIONS

International Search Report of PCT/JP2010/063346, mailing date of Aug. 31, 2010.

(Continued)

*Primary Examiner* — Thao Le
(74) *Attorney, Agent, or Firm* — Westerman, Hattori, Daniels & Adrian, LLP

(57) ABSTRACT

Disclosed are an application method, device and program which enable the constant retention of a fillet shape, without altering the shape due to the speed differences associated with changes in the direction of the nozzle or differences in the degree of penetration when bumps are arranged non-uniformly. In a liquid material application method a desired application pattern is created, liquid material is discharged from a nozzle whilst the nozzle and a workpiece are moved relative to one another, and the gap between a substrate and the workpiece, the workpiece being placed above the substrate by means of at least three bumps, is filled up with liquid material by capillary action. If bumps are arranged non-uniformly, the supply quantity per unit area of the application pattern is set so that a greater quantity is supplied to application areas next to areas where the integration density of bumps is high, than is supplied to application areas next to areas where the integration density of bumps is low.

12 Claims, 13 Drawing Sheets

(56) References Cited

U.S. PATENT DOCUMENTS

| | | | |
|---|---|---|---|
| 8,197,738 B2* | 6/2012 | Ikushima | 264/263 |
| 8,205,957 B2* | 6/2012 | Ito et al. | 347/19 |
| 2008/0064146 A1 | 3/2008 | Tajimi | |
| 2009/0295858 A1* | 12/2009 | Ito et al. | 347/17 |
| 2010/0052198 A1 | 3/2010 | Ikushima | |
| 2010/0075021 A1 | 3/2010 | Ikushima | |
| 2012/0229548 A1* | 9/2012 | Ito et al. | 347/14 |

FOREIGN PATENT DOCUMENTS

| | | |
|---|---|---|
| JP | 2008-71883 A | 3/2008 |
| WO | 2008/053952 A1 | 5/2008 |
| WO | 2008/053953 A1 | 5/2008 |
| WO | 2008/096721 A1 | 8/2008 |

OTHER PUBLICATIONS

Supplementary European Search Report dated Jan. 15, 2014, issued in European Patent Application No. 10808171 (3 pages).

* cited by examiner (a)

(b)

(a)

(b)

(a)

40  (b)

(c)

METHOD FOR APPLYING LIQUID MATERIAL, APPLICATION DEVICE AND PROGRAM

TECHNICAL FIELD

The present invention relates to a liquid material application method for filling a liquid material, discharged from a discharging device, into a gap between a substrate and a workpiece placed on the substrate by capillary action, and also relates to an application apparatus and a program for use in carrying out the method. For example, the present invention relates to an application method which can, in an underfilling process for packaging semiconductors, stabilize a shape of the applied liquid material (called a fillet shape) without changing a moving speed of the discharging device, and also relates to an application apparatus and a program for use in carrying out the method.

It is to be noted that, in this description, the term "discharge amount" implies an amount of the liquid material discharged from a nozzle with one discharge, and the term "application amount" implies an amount of the liquid material required for a certain area (e.g., an application pattern or an application region) over which the liquid material is discharged plural times.

BACKGROUND ART

There is a flip chip technique as one of techniques for mounting semiconductor chips. With the flip chip technique, protrusive electrodes (bumps) are formed on the surface of the semiconductor chip, and those protrusive electrodes are directly connected to electrode pads on a substrate.

In the flip chip packaging, stresses generated due to the difference in thermal expansion coefficient between a semiconductor chip 30 and a substrate 29 are concentrated at a connecting portion 33 between them. To prevent the connecting portion 33 from being broken by the concentrated stresses, a resin 34 is filled in a gap between the semiconductor chip 30 and the substrate 29 with intent to reinforce the connecting portion 33. Such a process is called "underfilling" (see FIG. 6).

The underfilling process is performed by applying the liquid resin 34 along an outer periphery of the semiconductor chip 30 such that the resin 34 is filled into the gap between the semiconductor chip 30 and the substrate 29 by capillary action, and then heating the resin 34 in an oven, for example, to thereby harden the resin 34.

With the underfilling, a corner portion 35 made of the liquid resin 34 is formed in an edge portion demarcated by a side surface of the semiconductor chip 30 and the substrate 29. Such a corner portion is called a "fillet" (see FIG. 7). When the fillet 35 is not formed uniformly, the following problems, for example, arise. Air may enter the gap through a portion where the fillet 35 is relatively small, thus causing entrapment of air bubbles. The resin 34 may protrude over to an application prohibited region around the application target chip 30. The semiconductor chip 30 may be damaged when the resin 34 is heated to be hardened. Accordingly, the fillet 35 is required to be uniformly formed at a certain width (denoted by 36) and a certain height (denoted by 37).

Techniques for uniformly forming the fillet are proposed (disclosed) in Patent Document 1 and Patent Document 2.

In more detail, Patent Document 1 discloses a method for manufacturing a semiconductor package having a structure that a resin is filled in a gap between a semiconductor chip and a substrate mounted on the semiconductor chip, wherein a speed of a nozzle for supplying the resin is adjusted such that the resin supplied along one side of the semiconductor chip is supplied to a central portion of the semiconductor chip in larger amount than to an end portion of the semiconductor chip.

Also, Patent Document 2 discloses a method of moving a nozzle around a semiconductor chip that is face-down mounted to a wiring board, and filling an underfill material into a gap between the wiring board and the semiconductor chip by continuously supplying the underfill material from the nozzle, wherein a nozzle moving path is made up of a linear path positioned within a region between a pair of segments, which are drawn from both ends of a side of the semiconductor chip perpendicularly to the side, and a direction change path along which the nozzle moving path is changed to connect two linear paths adjacent to each other, the direction change path being continued to the linear path, and wherein the nozzle is moved at a lower speed in at least a portion of the linear path than in the direction change path.

PRIOR ART LIST

Patent Documents

Patent Document 1: Japanese Patent Laid-Open Publication No. H10-50769
Patent Document 2: Japanese Patent Laid-Open Publication No. 2008-71883

SUMMARY OF THE INVENTION

Problems to be Solved by the Invention

The techniques for adjusting a supply amount of the liquid resin, disclosed in Patent Document 1 and Patent Document 2, are carried out by adjusting the nozzle moving speed while the liquid resin supplied from the nozzle is applied to be drawn on the substrate.

However, changing the nozzle moving speed while the liquid resin is applied to be drawn on the substrate increases a load imposed on a driving means and raises a problem that a larger excessive load is imposed as a speed difference between before and after the change of the nozzle moving speed, and the lifetime of the driving means is shortened. Another problem is that control is complicated because the supply amount of the liquid resin is adjusted on the basis of the nozzle moving speed. Still another problem is that changing the nozzle moving speed while the liquid resin is applied to be drawn on the substrate causes unwanted vibration in an apparatus and degrades the application accuracy.

In view of the above-mentioned problems, an object of the present invention is to provide an application method, an apparatus and a program, which can hold constant a fillet shape by eliminating a variation of the fillet shape, the variation being possibly caused due to the difference in a penetration rate of a liquid material when bumps are non-uniformly arranged, or due to the speed difference of a nozzle when the nozzle is changed in its moving direction.

Means for Solving the Problems

In trying to solve the above-mentioned problems, the inventor has found that one of the factors causing the variation of the fillet shape is the arrangement of bumps 31 formed on the semiconductor chip 30. In the underfilling process, as described above, the liquid resin 34 is filled into the gap between the semiconductor chip 30 and the substrate 29 by capillary action. The penetration rate of the liquid resin 34 into the gap is affected by not only a width of the gap, but also an arrangement density of the bumps 31 that are present at the inner side of the gap. Suppose, for example, the semiconductor chip 30 in which the bumps 31 are arranged at different densities, as illustrated in FIG. 8. The liquid resin 34 is applied along one side of the semiconductor chip 30. In general, the liquid resin 34 penetrates into the gap relatively fast in an region 38 where the bumps 31 are arranged at a higher density, while the liquid resin 34 penetrates into the gap relatively slowly in a region 39 where the bumps 31 are arranged at a lower density. Therefore, when the liquid resin 34 is applied in a constant application amount per unit area as illustrated in FIG. 8(a), the fillet is formed at a non-uniform width and/or a non-uniform height due to the above-described difference in the penetration rate. Consequently, a variation of the fillet shape is caused as illustrated in FIG. 8(b).

Another factor causing the variation of the fillet shape is an influence of change in the nozzle moving speed during the application operation. When the liquid resin is applied along an L- or U-like path that requires the nozzle moving direction to be changed, the nozzle moving speed has to be slowed down at a corner (direction change area) to change the nozzle moving direction. In other words, when the liquid resin is applied in a constant amount, the application amount is increased at the corner and the variation of the fillet shape is generated as illustrated in FIG. 9.

In practice, as illustrated in FIG. 10, the variation of the fillet shape is more complicated due to a combined influence of the different arrangement densities of the bumps and the slowing-down at the corner.

Thus, on the basis of the inference that there is a relationship between the arrangement of the bumps 31 formed on the semiconductor chip 30 and the shape of the fillet formed in the underfilling process for the semiconductor chip 30, the inventor has set up a hypothesis that the variation of the fillet shape can be eliminated by changing the application amount of the liquid resin per unit area in an application target region, and has tried to prove the hypothesis.

As a result, the inventor has found that adjusting the supply amount of the liquid resin from a discharging device is effective in changing the application amount of the liquid resin per unit area in the application target region. Stated another way, the inventor has found that applying the liquid resin in an amount required per unit area in the application target region is important in order to uniformly form the fillet shape without being affected by the arrangement of the bumps.

Also, the inventor has found that supplying the liquid resin in an amount required per unit area in the application target region is important in order to uniformly form the fillet shape without being affected by the change of the nozzle moving speed, which is generated with the change of the nozzle moving direction.

Further, the inventor has recognized that a discharging device of the type discharging the liquid resin in a flying manner or in the form of droplets is effective as a means for changing, on the discharging device side, the application amount of the liquid resin per unit area in the application target region, and has accomplished the present invention through intensive studies on the bases of such recognition.

In more detail, according to a first aspect of the present invention, there is provided a liquid material application method comprising the steps of creating a desired application pattern, discharging a liquid material from a nozzle while the nozzle and a workpiece are moved relative to each other, and filling the liquid material into a gap between a substrate and the workpiece by capillary action, the workpiece being placed on the substrate with three or more bumps interposed therebetween, wherein when the bumps are non-uniformly arranged, a supply amount of the liquid material per unit area in the application pattern is set such that the liquid material is supplied to an application region adjacent to an area having a higher integration degree of the bumps in a larger amount than to an application region adjacent to an area having a lower integration degree of the bumps.

According to a second aspect of the present invention, in the first aspect of the present invention, the supply amount of the liquid material is increased in the application region adjacent to the area having a higher integration degree in comparison with the supply amount in the application region adjacent to the area having a lower integration degree of the bumps.

According to a third aspect of the present invention, in the first or second aspect of the present invention, the supply amount of the liquid material is reduced in the application region adjacent to the area having a lower integration degree in comparison with the supply amount in the application region adjacent to the area having a higher integration degree of the bumps.

According to a fourth aspect of the present invention, there is provided a liquid material application method comprising the steps of creating a desired application pattern, discharging a liquid material from a nozzle while the nozzle and a workpiece are moved relative to each other, and filling the liquid material into a gap between a substrate and the workpiece by capillary action, the workpiece being placed on the substrate with three or more bumps interposed therebetween, the method further comprising an initial parameter setting step of specifying, as a total pulse number, the number of times of transmitting a discharge pulse signal and a pause pulse signal, specifying, of the total pulse number, the number of discharge pulse signals necessary to achieve a required application amount of the liquid material, and specifying the rest as the number of pause pulse signals; a correction amount calculating step of measuring a discharge amount of the liquid material from a discharging device, and calculating a correction amount of the discharge amount; and a discharge amount correcting step of adjusting the number of discharge pulse signals and the number of pause pulse signals on the basis of the correction amount calculated in the correction amount calculating step, wherein when the bumps are non-uniformly arranged, the number of the discharge pulse signals per unit area is adjusted in the discharge amount correcting step to be larger in an application region adjacent to an area having a higher integration degree of the bumps than in an application region adjacent to an area having a lower integration degree of the bumps.

According to a fifth aspect of the present invention, there is provided a liquid material application method comprising the steps of discharging a liquid material from a nozzle while the nozzle and a workpiece are moved relative to each other, and filling the liquid material into a gap between a substrate and the workpiece by capillary action, the workpiece being placed on the substrate with three or more bumps interposed therebetween, the method further comprising a step of creating an application pattern made up of a plurality of continuous application regions; a discharge cycle assigning step of assigning, to the respective application regions, a plurality of discharge cycles in each of which the number of discharge pulse signals and the number of pause pulse signals are combined at a predetermined ratio; a correction amount calculating step of measuring a discharge amount of the liquid material from a discharging device, and calculating a correction amount of the discharge amount; and a discharge amount correcting step including a step of adjusting the number of discharge pulse signals and the number of pause pulse signals, both included in the application pattern, and/or a step of adjusting a length of at least one of the application regions and a length of other one or two application regions, which are present in continuation with the one application region, without changing a discharge amount of the liquid material per unit time in each application region, the discharge amount correcting step being performed, when the bumps are non-uniformly arranged, on the basis of the correction amount calculated in the correction amount calculating step such that the supply amount of the liquid material per unit area becomes larger in an application region adjacent to an area having a higher integration degree of the bumps than in an application region adjacent to an area having a lower integration degree of the bumps.

According to a sixth aspect of the present invention, in the fourth or fifth aspect of the present invention, the discharge amount is corrected without changing a frequency of transmitting the discharge pulse signals and the pause pulse signals.

According to a seventh aspect of the present invention, there is provided a liquid material application method comprising the steps of creating a desired application pattern, discharging a liquid material from a nozzle while the nozzle and a workpiece are moved relative to each other, and filling the liquid material into a gap between a substrate and the workpiece by capillary action, the workpiece being placed on the substrate with three or more bumps interposed therebetween, the method further comprising an initial parameter setting step of specifying an interval between unit cycles in each of which the liquid material is discharged once; and a correction amount calculating step of measuring a discharge amount of the liquid material from a discharging device, and calculating a correction amount of the discharge amount, wherein when the bumps are non-uniformly arranged, the interval between the unit cycles included in the application pattern is adjusted on the basis of the correction amount calculated in the correction amount calculating step such that a supply amount of the liquid material per unit area becomes larger in an application region adjacent to an area having a higher integration degree of the bumps than in an application region adjacent to an area having a lower integration degree of the bumps.

According to an eighth aspect of the present invention, in any one of the first to seventh aspects of the present invention, when the application pattern is an application pattern that does not require direction change of the nozzle, the liquid material is applied without changing a relative moving speed between the nozzle and the workpiece.

According to a ninth aspect of the present invention, in any one of the first to seventh aspects of the present invention, when the application pattern is an application pattern including an application region that requires direction change of the nozzle, the supply amount of the liquid material per unit area in the application pattern is set such that the liquid material is supplied to an application region not requiring the direction change of the nozzle in a larger amount than to an application region requiring the direction change of the nozzle.

According to a tenth aspect of the present invention, there is provided a liquid material application apparatus comprising a discharging device provided with a nozzle, a driving mechanism for moving the discharging device and a workpiece relative to each other, a detection device for detecting a shape of the applied liquid material, and a control unit for controlling operations of the aforementioned components, wherein the control unit is operated to carry out the liquid material application method according to any one of the first to ninth aspects of the present invention.

According to an eleventh aspect of the present invention, there is provided a program for use in an application apparatus comprising a discharging device provided with a nozzle, a driving mechanism for moving the discharging device and a workpiece relative to each other, a detection device for detecting a shape of the applied liquid material, and a control unit for controlling operations of the aforementioned components, wherein the program causes the control unit to carry out the liquid material application method according to any one of the first to ninth aspects of the present invention.

Advantageous Effect of the Invention

With the present invention, the fillet shape can be held constant by eliminating the variation of the fillet shape, which may be caused due to the difference in the penetration rate of the liquid material when the bumps are non-uniformly arranged, or due to the speed difference of the nozzle when the nozzle is changed in its moving direction.

Further, since the relative moving speed of the nozzle is not changed except for an area where the nozzle moving direction is changed, a load imposed on the driving mechanism can be reduced, whereby generation of vibration can be suppressed and the application accuracy can be improved.

BRIEF DESCRIPTION OF THE DRAWINGS

FIG. 8(a) is a plan view, partly seen through, to explain a state when a liquid resin (liquid material) is applied in a constant amount per unit area to a semiconductor chip in which there is a difference in density of the bump arrangement. FIG. 8(b) is a plan view, partly seen through, to explain a fillet shape after the liquid resin has been applied in a constant amount per unit area to the semiconductor chip in which there is a difference in density of the bump arrangement.

FIG. 11(a) is a plan view to explain an application pattern that reduces a supply amount of the liquid material per unit area at a corner. FIG. 11(b) is a plan view to explain a fillet shape after the liquid material has been applied in accordance with the application pattern that reduces the supply amount of the liquid material per unit area at the corner.

FIG. 12(a) is a plan view, partly seen through, to explain an application pattern that increases and reduces the supply amount of the liquid material per unit area depending on the different densities of the bumps. FIG. 12(b) is a plan view, partly seen through, to explain a fillet shape after the liquid material has been applied in accordance with the application pattern that increases and reduces the supply amount of the liquid material per unit area depending on the different densities of the bumps.

FIG. 13(a) is a plan view, partly seen through, to explain a fillet shape after the liquid material has been applied in a constant amount per unit area to the semiconductor chip in which there is a difference in the density of the bump arrangement at the inner position of the semiconductor chip. FIG. 13(b) is a plan view, partly seen through, to explain an application pattern that increases and reduces the supply amount of the liquid material per unit area depending on the different densities of the bumps. FIG. 13(c) is a plan view, partly seen through, to explain a fillet shape after the liquid material has been applied in accordance with the application pattern that increases and reduces the supply amount of the liquid material per unit area depending on the different densities of the bumps.

FIG. 15(a) is an illustration to explain a length of each of the divided application regions in an application pattern. FIG. 15(b) is an illustration to explain a discharge amount of the liquid material per unit length in each of the divided application regions before correction. FIG. 15(c) is an illustration to explain a discharge amount of the liquid material per unit length in each of the divided application regions after the correction.

MODE FOR CARRYING OUT THE INVENTION

A mode for carrying out the present invention will be described below.

A discharging device used in an embodiment of the present invention is a jet type discharging device in which a valve member is driven upon receiving a pulse signal and the valve member is impinged against a valve seat, whereby a liquid material is caused to fly to be discharged from a nozzle. In that type of discharging device, one discharge is performed by receiving one pulse signal. In this embodiment, the liquid material is applied by transmitting the pulse signal at a preset frequency.

Figure 1:
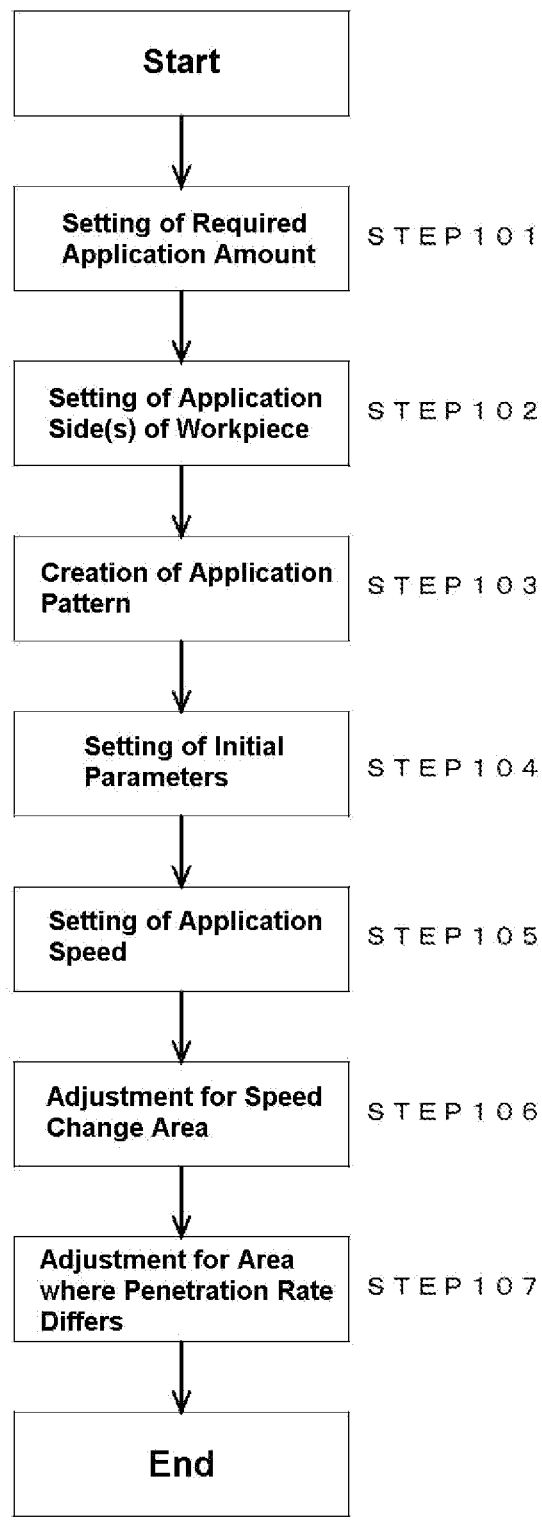
FIG. 1 is a flowchart illustrating procedures for adjusting a supply amount of a liquid material according to the present invention.

Procedures for adjusting, in the discharging device, an application amount of the liquid material per unit area (or unit length) in an application target region according to this embodiment will be described below (see FIG. 1). It is to be noted that the present invention is applicable to discharging devices of the type discharging the liquid material in a flying manner or in the form of droplets, and the applicable discharging device is not limited to the jet type.

(1) Setting of Required Application Amount (STEP 101)

First, an amount of the liquid material, which is required to fill a gap between a substrate and a workpiece and to form a fillet, is determined. The required application amount may be determined as a theoretical value from the design drawing, for example, or may be determined by actually applying the liquid material. However, because the theoretical value is an ideal value, it is preferable to determine the required application amount by actually applying the liquid material from the viewpoint of realizing accurate application. Further, the required application amount may be determined in terms of volume or mass. On that occasion, a density value of the liquid material used is also necessary.

A time necessary to discharge the required application amount is determined from the amount of the liquid material discharged with one discharge and a time necessary for one discharge. The amount of the liquid material discharged with one discharge and the time necessary for one discharge depend on the properties of the liquid material, the shape (diameter and length) of the nozzle, the distance (stroke) through which the valve member is moved, and so on. Therefore, those values are preferably measured by actually discharging the liquid material. At that time, the measurement accuracy can be improved by discharging the liquid material plural times and calculating a mean value.

(2) Setting of Application Pattern (STEP 102)

One or more sides of the workpiece are set in consideration of the arrangement of bumps (connecting portions) that connect the workpiece and the substrate to each other, situations of other components around the workpiece, and so on. For example, the setting is made such that the liquid material is applied linearly along one side of a rectangular workpiece or applied in an L-like shape along two adjacent sides thereof. An application pattern is obtained with that setting.

Once the application pattern is decided, an application length is also decided. From the application length and the discharge time determined in above (1), a nozzle moving speed is temporarily determined on condition that the nozzle moving speed is constant over the entire application pattern.

(3) Creation of Application Pattern (STEP 103)

The application pattern is created in consideration of, e.g., the application amount and the application length that depend on the shape of the workpiece. Here, the term "application length" implies a total length of the distance through which the nozzle and the workpiece are moved relative to each other.

The application pattern is made up of one or more discharge pulses and zero or more pause pulse(s). Pulse signals including the discharge pulses and the pause pulses are transmitted at the predetermined frequency. The frequency and the number of shots per second are matched with each other in principle. The frequency is preferably several tens hertz and more preferably several hundreds hertz.

It is to be noted that the frequency is determined from the total length of the application pattern, the weight or volume of the liquid material 34 required for the application pattern, and so on.

(4) Setting of Initial Parameters (STEP 104)

The following parameters are set as initial parameters.

(i) Discharge Frequency (Unit Cycle)

Because the discharging device used in this embodiment is the jet type, one discharge is performed by one operation of the valve member. Such one discharge is called a "unit cycle". In this embodiment, the liquid material is applied by repeating the unit cycle at the predetermined frequency.

There is an optimum frequency range for the predetermined frequency. If the frequency departs from the optimum range, a failure, such as no jetting of the liquid material, may occur. For that reason, a range within which the liquid material is normally jet is determined in advance by experiments. The predetermined frequency is set to about 100 to 200 hertz, for example, though depending on the characteristics of the liquid material and the discharge amount thereof.

Thus, the optimum frequency range is determined on the basis of the mechanical response performance and the characteristics of the liquid material. As described above, the discharge amount of the liquid material is changed with change of the frequency, and if the frequency departs from the optimum range, a failure, such as no jetting of the liquid material, may occur. In addition, a change characteristic of the discharge amount with respect to change of the frequency is not linear. Accordingly, it is basically preferable that the frequency once set is not changed within the same application pattern. However, since there is a certain allowable range for the frequency as described above, the discharge amount can be adjusted by changing the frequency insofar as the frequency is held within the allowable range.

That point is described in more detail below. It is assumed, for example, that a pulse signal having one unit cycle, in which an on-state time is 3 [msec] and an off-state time is 4 [msec], is an optimum for achieving the optimum discharge amount. A frequency in the case of such a unit cycle is about 142 hertz. On the basis of such a unit cycle, it is tried to change the frequency within the above-mentioned frequency range (about 100 to 200 hertz). It is here assumed that, to change the frequency, the off-state time is changed while the on-state time is kept fixed. First, assuming the case that the off-state time is changed to become shorter, the frequency is about 166 hertz when the off-state time is shortened to 3 [msec], and 200 hertz when the off-state time is shortened to 2 [msec]. Therefore, a limit on the shorter side of the off-state time is 2 [msec]. Conversely, assuming the case that the off-state time is changed to become longer, the frequency is about 125 hertz when the off-state time is prolonged to 5 [msec], about 111 hertz at 6 [msec], and 100 hertz at 7 [msec]. Therefore, a limit on the longer side of the off-state time is 7 [msec]. After the limit range of the off-state time has been determined in such a way, the relationship between the off-state time and the discharge amount is previously determined by conducting an experiment for each setting of plural pairs of the off- and on-state times, and the determined relationship is stored in a control unit. Further, when an adjustment is performed as described later, one of the settings, which one is suitable for the adjustment, is selected.

It is needless to say that, while the off- and on-state times are each set as an integer in the above-described embodiment, the off- and on-state times can also be set as a real number (including a decimal fraction) in order to obtain a larger number of setting values at finer intervals.

There is a possibility that, when values just close to the limit values of the frequency range described above are used, the actual frequency may vary into the range where a failure, such as no jetting of the liquid material, may occur, due to an influence of, e.g., the characteristics of the liquid material or change of the ambient temperature. Accordingly, it is preferable to set the off- and on-state times, i.e., to set the frequency, with sufficient margins without using values just close to the limit values of the frequency range.

(ii) Pulse Number (Numbers of Discharge and Pause Pulses)

The number of discharge pulses and the number of pause pulses, which constitute the application pattern, are set. The control unit previously stores a setting table that specifies combinations of the number of discharge pulses and the number of pause pulses.

Table 1 represents one example of the setting table stored in the control unit. In Table 1, a setting example A indicates a setting example of the discharge amount when the total pulse number is 100, a setting example B indicates a setting example of the discharge amount when the total pulse number is 111, and a setting example C indicates a setting example of the discharge amount when the total pulse number is 125. In each of the setting examples A, B and C, the number of discharge pulses corresponds to the discharge amount, and the discharge amount can be adjusted by increasing or decreasing the number of pause pulses in the total pulse number.

The setting example A specifies individual setting examples for changing the discharge amount on the basis of a combination in which the pause pulse is not set for every discharge pulse (i.e., the number of pause pulses is 0) when the number of discharge pulses is 100.

The setting example B specifies individual setting examples for changing the discharge amount on the basis of a combination in which one pause pulse is set for every nine discharge pulses (i.e., the number of pause pulses is 11) when the number of discharge pulses is 100.

The setting example C specifies individual setting examples for changing the discharge amount on the basis of a combination in which one pause pulse is set for every four discharge pulses (i.e., the number of pause pulses is 25) when the number of discharge pulses is 100.

When the number of pause pulses is increased, or when the number of pause pulses is increased or decreased in later-described correction of the discharge amount, the initial parameters are preferably set such that timings of the pause pulses occur at equal intervals.

In the underfilling process, when the number of pause pulses is increased to two or three, it is preferable from the viewpoint of preventing entrapment of air bubbles to make smaller a gap (non-application region) by reducing the number of discharge pulses relative to the number of pause pulses rather than enlarging the gap (non-application region) by supplying the pause pulses in continuation.

TABLE 1

| A | | B | | C | | | |
|---|---|---|---|---|---|---|---|
| Number of discharge pulses | Number of pause pulses | Number of discharge pulses | Number of pause pulses | Number of discharge pulses | Number of pause pulses | Number of discharge pulses | Number of pause pulses |
| 1 | 0 | 100 | 0 | 111 | 0 | 125 | 0 |
| 10 | 1 | 91 | 9 | 101 | 10 | 114 | 11 |
| 9 | 1 | 90 | 10 | 100 | 11 | 113 | 12 |

TABLE 1-continued

| A | | B | | C | | | |
|---|---|---|---|---|---|---|---|
| Number of discharge pulses | Number of pause pulses | Number of discharge pulses | Number of pause pulses | Number of discharge pulses | Number of pause pulses | Number of discharge pulses | Number of pause pulses |
| 8 | 1 | 89 | 11 | 99 | 12 | 111 | 14 |
| 7 | 1 | 88 | 12 | 98 | 13 | 110 | 15 |
| 6 | 1 | 86 | 14 | 96 | 15 | 108 | 17 |
| 5 | 1 | 83 | 17 | 92 | 19 | 104 | 21 |
| 4 | 1 | 80 | 20 | 89 | 22 | 100 | 25 |
| 3 | 1 | 75 | 25 | 83 | 28 | 94 | 31 |
| 2 | 1 | 67 | 33 | 74 | 37 | 84 | 41 |
| 1 | 1 | 50 | 50 | 56 | 55 | 63 | 62 |

(5) Setting of Application Speed (STEP 105)

When an L- or U-shaped corner or the like exists in the application pattern, the nozzle moving speed is changed at such a corner to reduce the load imposed on the driving mechanism. The reason is that the nozzle moving speed at the corner is restricted because of mechanical rigidity of the driving mechanism. Usually, the nozzle moving speed is required to be slowed down at the corner. On the other hand, the speed set in above (2) is not changed in an area other than the corner. When a speed difference between the corner and the area other than the corner is large, the speed is preferably changed several times step by step instead of changing the speed once.

(6) Setting of Parameters Regarding Discharge

Parameters regarding the discharge are adjusted depending on the application pattern and the application speed. The adjustment is performed in two steps described below.

(i) Adjustment for Speed Change Area (STEP 106)

When the nozzle moving speed is changed in some area, the supply amount of the liquid material per unit area is changed in the relevant area. In consideration of such a change, the liquid material is applied in accordance with the pattern, set in above (2), to the substrate in a bare state not including the workpiece and other components to be mounted thereon, and the width of an applied line is measured. When there is an area or zone where a measured value of the line width exceeds the allowable range, parameters regarding the discharge in such an area or zone are adjusted. In other words, when the line width is relatively wide, the parameters are adjusted such that the line width is reduced. On the other hand, when the line width is relatively narrow, the parameters are adjusted such that the line width is increased.

Figure 9:
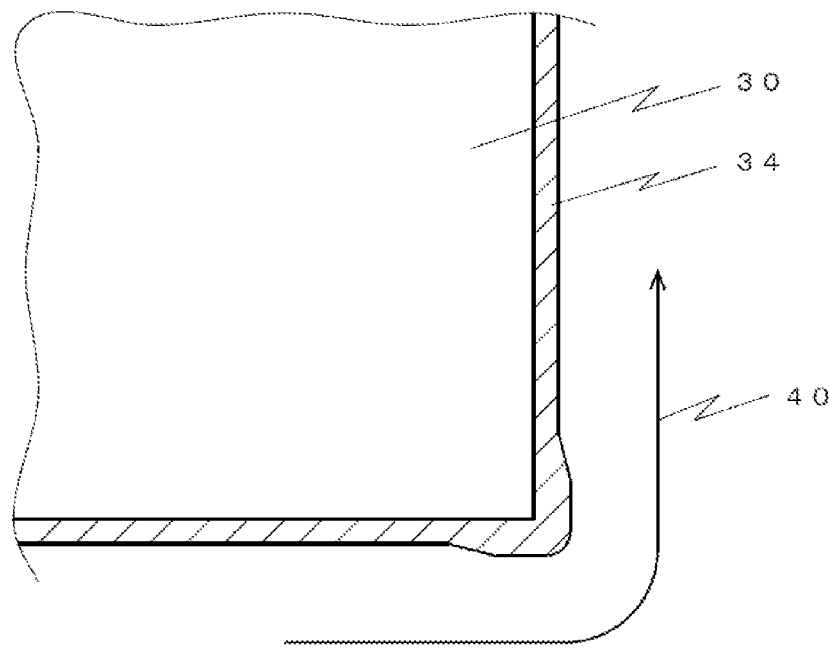
FIG. 9 is a plan view to explain an influence of change of a nozzle moving speed upon the fillet shape.
Figure 10:
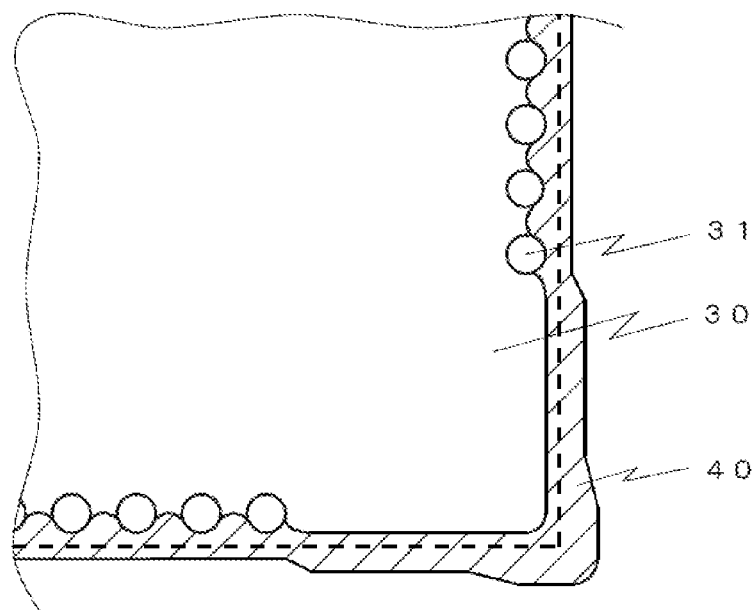
FIG. 10 is a plan view, partly seen through, to explain a combined influence of both the bump arrangement and the change of the nozzle moving speed upon the fillet shape.
Figure 11:
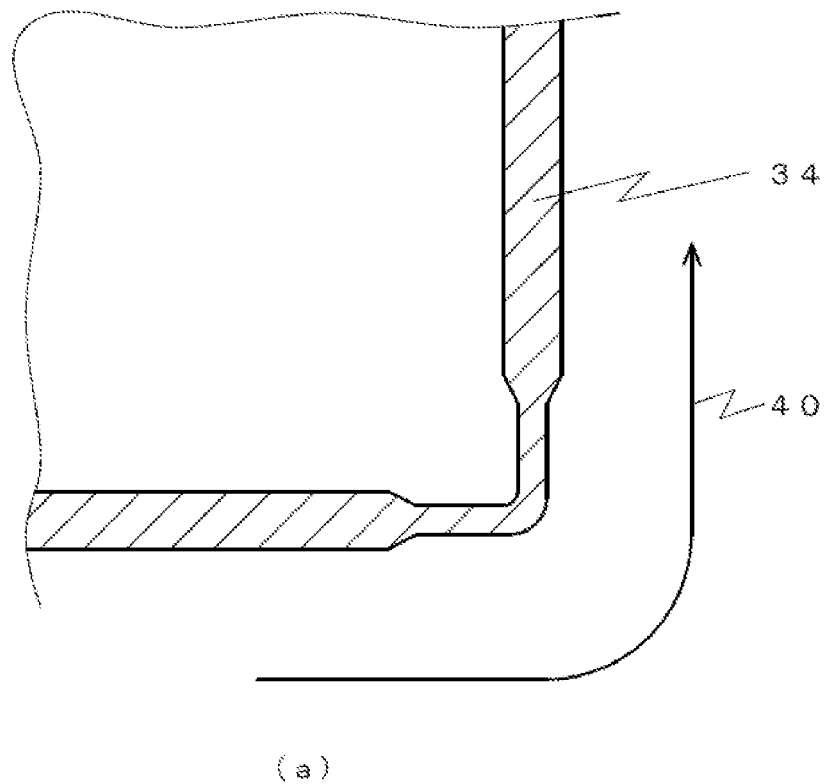
FIG. 11 is a plan view to explain an adjustment made in an area where the nozzle moving speed is changed. Specifically.
Figure 11:
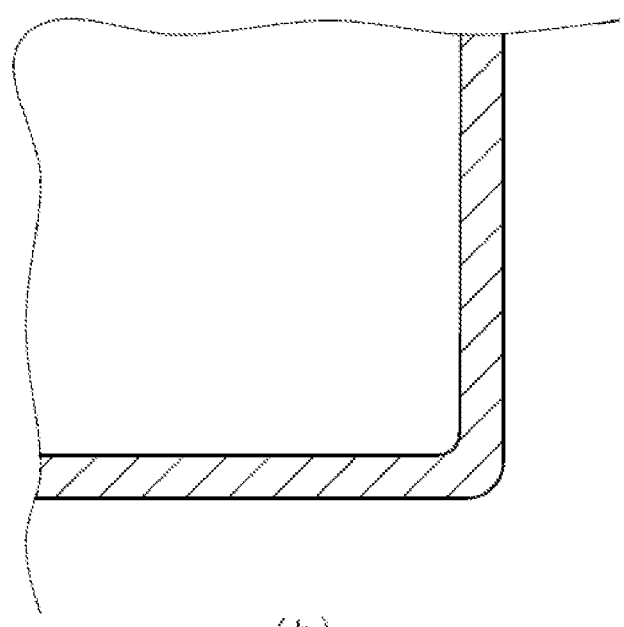

For example, when the line width is relatively wide at a corner due to the slowdown of the nozzle moving speed, as illustrated in FIG. 9, the parameters are adjusted to reduce the supply amount of the liquid material per unit area at the corner such that the line width at the corner where the line width is relatively wide becomes equal to that in a linear portion. Stated another way, the application pattern is created as a pattern which provides a smaller supply amount of the liquid material per unit area at the corner, as illustrated in FIG. 11(*a*), such that a fillet having the same line width as that in the linear portion is formed, as illustrated in FIG. 11(*b*), in the actual application in which the nozzle moving speed is slowed down at the corner.

The types of parameters to be adjusted in practice will be described later.

(ii) Adjustment for Area Having Different Penetration Rate (STEP 107)

When the liquid material is actually applied to an application target, the penetration rate of the liquid material differs even within the application pattern depending on the arrangement of the bumps that are present in the gap between the workpiece and the substrate. Therefore, the required application amount per unit area is changed. In view of such a change, the liquid material is applied to the substrate, on which the workpiece is mounted, in accordance with the pattern having been set in above (2), and the width of a fillet formed by applying the liquid material is measured by taking an image of the fillet with an image pickup device. When there is an area or zone where a measured value of the fillet width exceeds the allowable range, parameters regarding the discharge in such an area or zone are adjusted. In other words, when the fillet width is relatively wide, the parameters are adjusted such that the fillet width is reduced. On the other hand, when the fillet width is relatively narrow, the parameters are adjusted such that the fillet width is increased.

Figure 8:
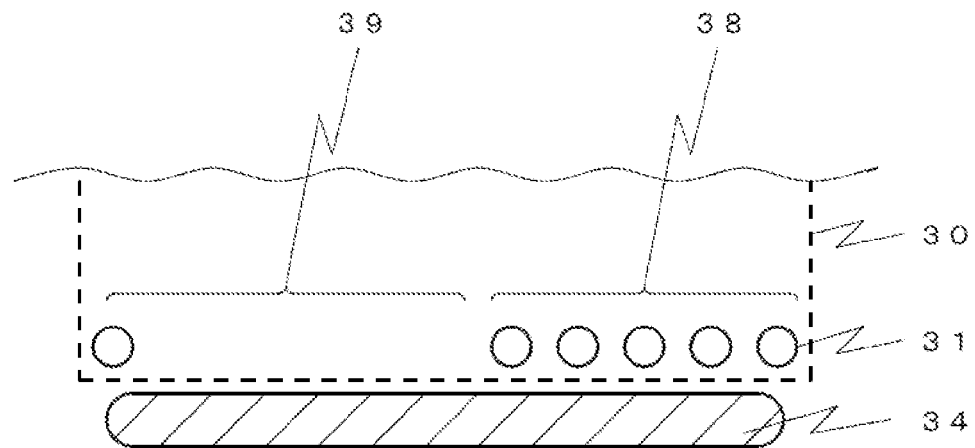
FIG. 8 is a plan view, partly seen through, to explain an influence of a bump arrangement upon a fillet shape. Specifically.
Figure 8:
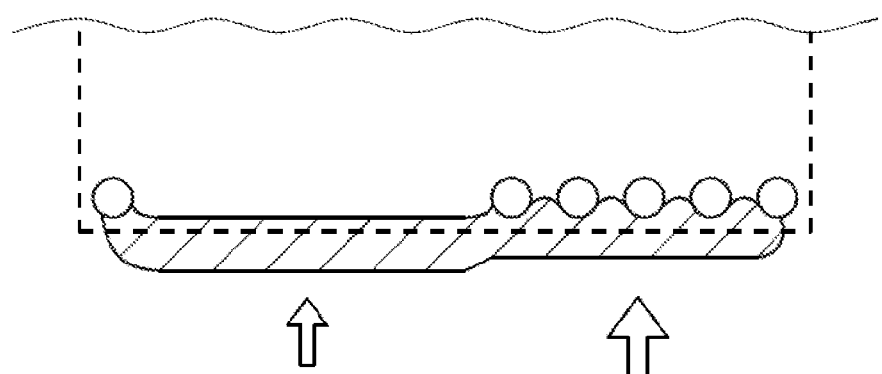
Figure 12:
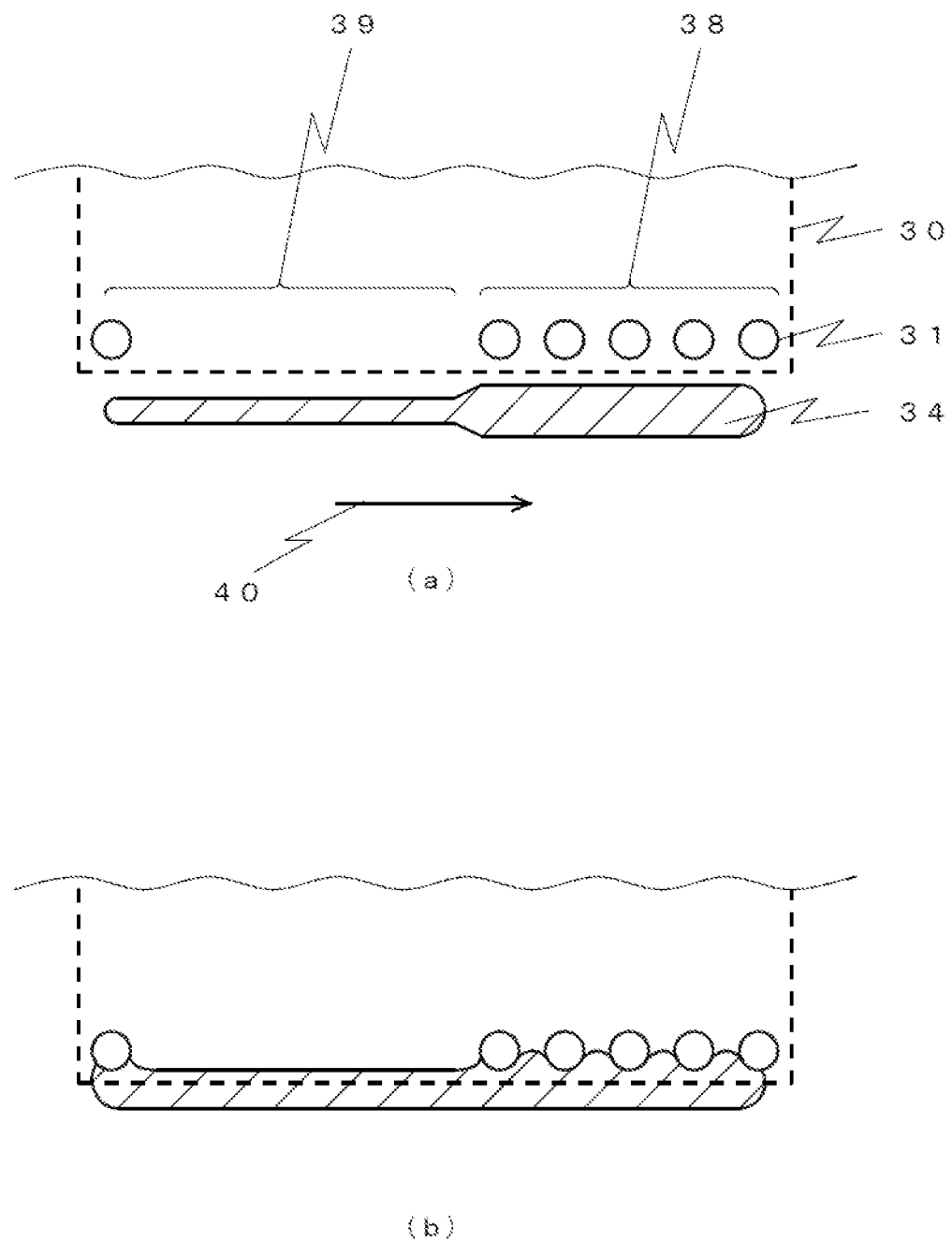
FIG. 12 is a plan view, partly seen through, to explain an adjustment made in an area where there is a difference in penetration rate of the liquid material due to a difference in the density of the bump arrangement near an edge of the semiconductor chip. Specifically.

For example, when the line width is relatively narrow in an area having a higher bump density (i.e., an area having a higher degree of integration), as illustrated in FIG. 8, the parameters are adjusted to increase the supply amount of the liquid material per unit area in the area having a higher bump density such that the line width in the area where the line width is relatively narrow becomes equal to that in an area having a lower bump density (i.e., an area having a lower degree of integration). Alternatively, the parameters may be adjusted to reduce the supply amount of the liquid material per unit area in the area having a lower bump density. As a result of adjusting the parameters, the application pattern is created as a pattern which provides a larger supply amount of the liquid material per unit area in the area having a higher bump density and a smaller supply amount of the liquid material per unit area in the area having a lower bump density, as illustrated in FIG. 12(*a*). Hence, a fillet having a constant width is formed, as illustrated in FIG. 12(*b*), in the actual application in which the penetration rate of the liquid material differs depending on in the areas having different bump densities. It is also possible to measure the height of a fillet by tanking an image of the fillet with an image pickup device, and to adjust the parameters regarding the discharge on the basis of the measured result.

Figure 13:
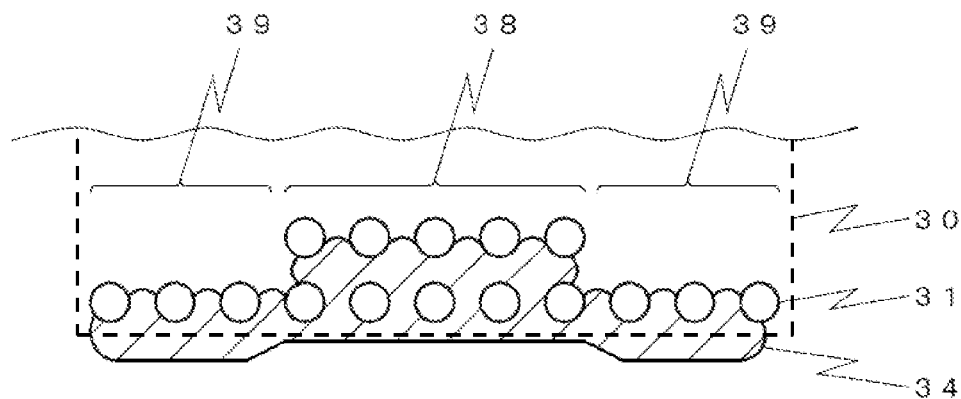
FIG. 13 is a plan view, partly seen through, to explain an adjustment made in an area where there is a difference in penetration rate of the liquid material due to a difference in the density of the bump arrangement at an inner position of the semiconductor chip. Specifically.
Figure 13:
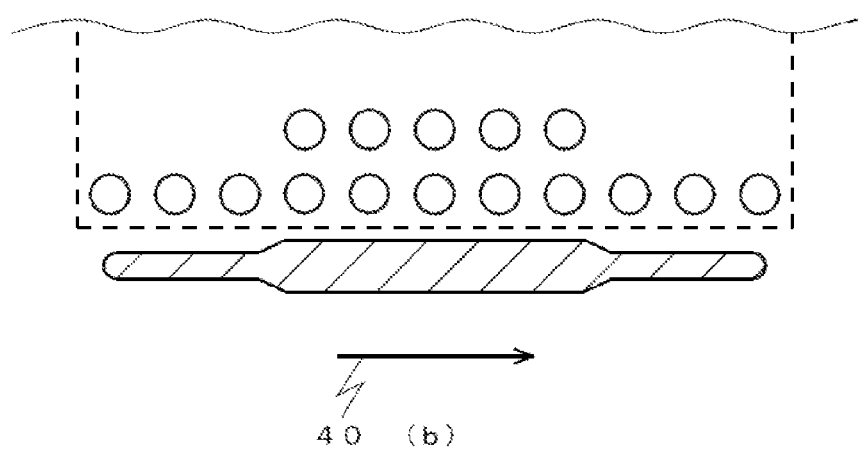
Figure 13:
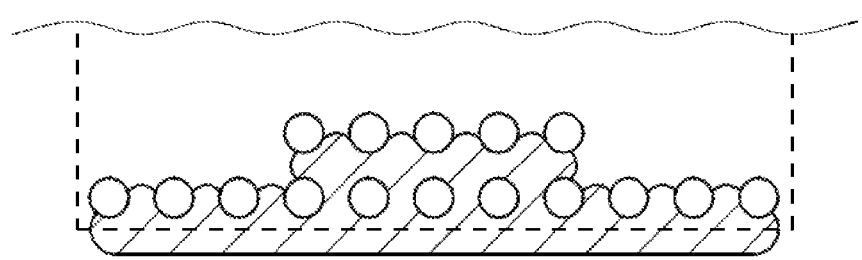

The adjustment can be similarly performed in not only the case where there is a difference in the density of the bump arrangement in a portion close to the edge of the semiconductor chip as illustrated in FIGS. 8 and 12, but also the case where there is a difference in the density of the bump arrangement at an inner position (in the side closer to a center) of the semiconductor chip. When the liquid material is applied at a constant nozzle speed and in a constant supply amount of the liquid material per unit area in the case of the bump arrangement illustrated in FIG. 13, for example, a problem arises in that the fillet width (line width) is varied as illustrated in FIG.

13(a). To cope with such a problem, the parameters are adjusted so as to increase the supply amount of the liquid material per unit area in the area having a higher bump density, or to reduce the supply amount of the liquid material per unit area in the area having a lower bump density such that the fillet width (line width) in the area having a higher bump density becomes equal to the fillet width (line width) in the area having a lower bump density. Thus, a fillet having a constant width, as illustrated in FIG. 13(c), can be formed by creating the application pattern illustrated in FIG. 13(b).

The types of parameters to be adjusted in practice are described below.

(iii) Types of Parameters Regarding Discharge

The parameters regarding the discharge, which are changed in performing the above-described adjustment, are as follows.

(iii-1) Discharge Frequency (Unit Cycle)

When changing the application amount per unit area in the discharge operation that is performed by repeating the above-mentioned unit cycle at the predetermined frequency, the interval between the unit cycles is adjusted on the basis of the value set in above (4)(i). More specifically, the application amount is increased by narrowing the interval between the unit cycles, and the application amount is reduced by widening the interval between the unit cycles. The relationship between the interval between the unit cycles and the discharge amount is determined as a guideline for setting of an extent of the adjustment in advance by experiments, for example, and the determined relationship is stored in, e.g., the control unit in the form of a setting table or a calculation formula.

(iii-2) Pulse Number (Discharge and Pause)

When the liquid material is discharged by transmitting the above-mentioned pulse signal, the application amount per unit area is changed as follows. A table is prepared by specifying, as a total pulse number, the number of times of transmitting the discharge pulse signal, i.e., the signal performing the discharge, and the pause pulse signal, i.e., the signal not performing the discharge, those signals being set as described in above (4)(ii), specifying, of the total pulse number, the number of discharge pulse signals necessary to achieve the application amount, and specifying the rest as the number of pause pulse signals. The application amount is then changed by changing the number of discharge pulse signals and the number of pause pulse signals on the basis of such a table. More specifically, the application amount is reduced by increasing the number of pause pulse signals in the total pulse number, and the application amount is increased by reducing the number of pause pulse signals. The relationship between the number of discharge pulse signals and the number of pause pulse signals and the discharge amount is determined as a guideline for setting an extent of the adjustment in advance by experiments, for example, and the determined relationship is stored in, e.g., the control unit in the form of a setting table or a calculation formula.

By changing the pulse number, the application amount can be changed without changing the application length.

(iii-3) Discharge Amount Changing Factors in Discharging Device

The application amount per unit area can also be changed by adjusting the discharge amount changing factors in the discharging device. For example, the following discharge amount changing factors in the discharging device are adjusted.

1) "Pressure" applied to a reservoir,
2) "Stroke", i.e., the distance through which the valve member is moved with one operation,
3) "Temperature" of a heater heating in the vicinity of the nozzle, and
4) "Nozzle diameter" of the nozzle discharging the liquid material.

Here, the magnitude of each of the above-mentioned factors corresponds to the magnitude of the discharge amount of the liquid material.

Which one of the parameters in above (iii-1) to (iii-3) is to be used for the adjustment is optimally selected on the basis of the result of measuring the line width or the fillet width by actually applying the liquid material to the bare substrate or the workpiece.

Further, the adjustment may be performed by combining plural ones of the parameters in above (iii-1) to (iii-3) with each other. In one exemplary method, the adjustment based on the parameter in above (iii-2) is primarily performed, and the adjustment based on the parameter in above (iii-1) or (iii-3) is additionally performed when the value of the former parameter reaches a limit of the adjustment range or when a fine adjustment is performed.

By executing STEP 101 to STEP 107 described above, the application amount per unit area in the application target region can be changed, whereby the fillet shape can be kept constant by eliminating a variation of the fillet shape, which may be generated due to the influence of the bump arrangement and the influence of the speed change with change of the nozzle moving direction.

Further, since the nozzle moving speed is not changed except for the area where the nozzle moving direction is changed, the load imposed on the driving mechanism can be reduced. It is, therefore, possible to suppress generation of vibration, improve the application accuracy, and to prolong the lifetime of the apparatus.

Details of the present invention will be described below in connection with Example, but the present invention is in no way restricted by the following Example.

EXAMPLE

[Discharging Device]

Figure 2:
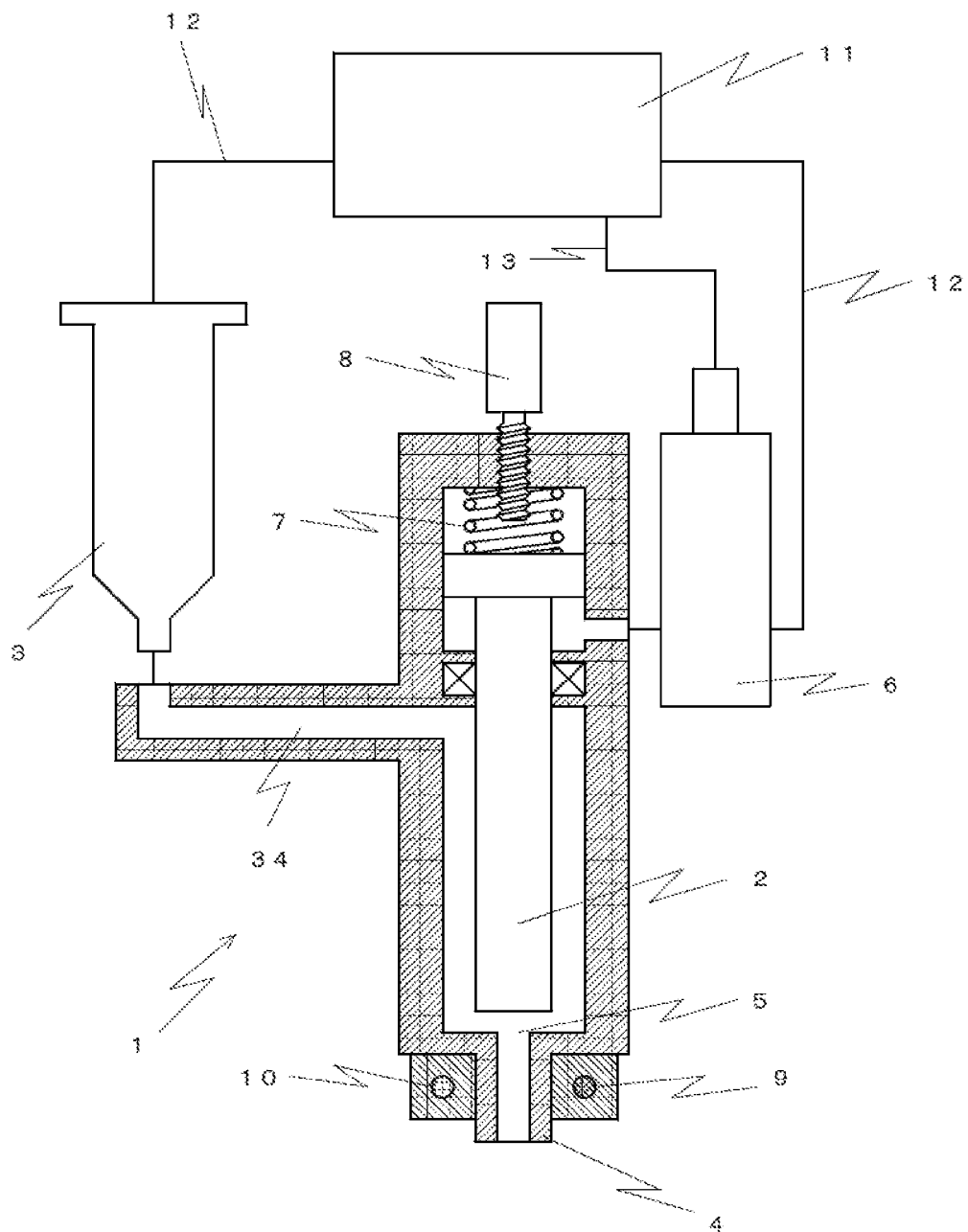
FIG. 2 is a sectional view of principal part of a jet type discharging device according to an embodiment.

A discharging device 1 includes, as illustrated in FIG. 2, a piston 2 that is a valve member disposed in a cylinder to be movable in up and down directions, a reservoir 3 pressurized by a compressed gas that is held under pressure regulated by a control unit 11, and a nozzle 4 that is in communication with the reservoir 3. The discharging device 1 further includes a selector valve 6 for supplying or exhausting a working gas, which is used to move the piston 2 upwards, through the control unit 11, and a spring 7 for biasing the piston 2 to move downwards. A stroke adjusting member 8 for adjusting the distance through which the piston 2 is moved is disposed above the spring 7. A heater 9 for heating the nozzle 4 and a liquid material 34, which is present within the nozzle 4, is disposed near the nozzle 4. A temperature sensor 10 is disposed on the side opposite to the heater 9 and is used in performing control to hold both the nozzle 4 and the liquid material 34, which is present within the nozzle 4, at a predetermined temperature.

When the selector valve 6 is operated in response to a pulse signal transmitted from the control unit 11 and the piston 2 is moved upwards and downwards, the liquid material 34 filled in the reservoir 3 is discharged in the form of liquid droplets from the nozzle 4. The liquid material 34 discharged from the nozzle 4 is applied in the form of dots to a substrate 29 or a weighing gauge 22, for example, which is properly positioned under the nozzle 4.

In response to one pulse signal, the discharging device 1 moves the piston 2 to reciprocate one cycle, thereby causing one droplet of the liquid material 34 to be discharged from the nozzle 4. In other words, one unit cycle corresponds to one shot.

Figure 3:
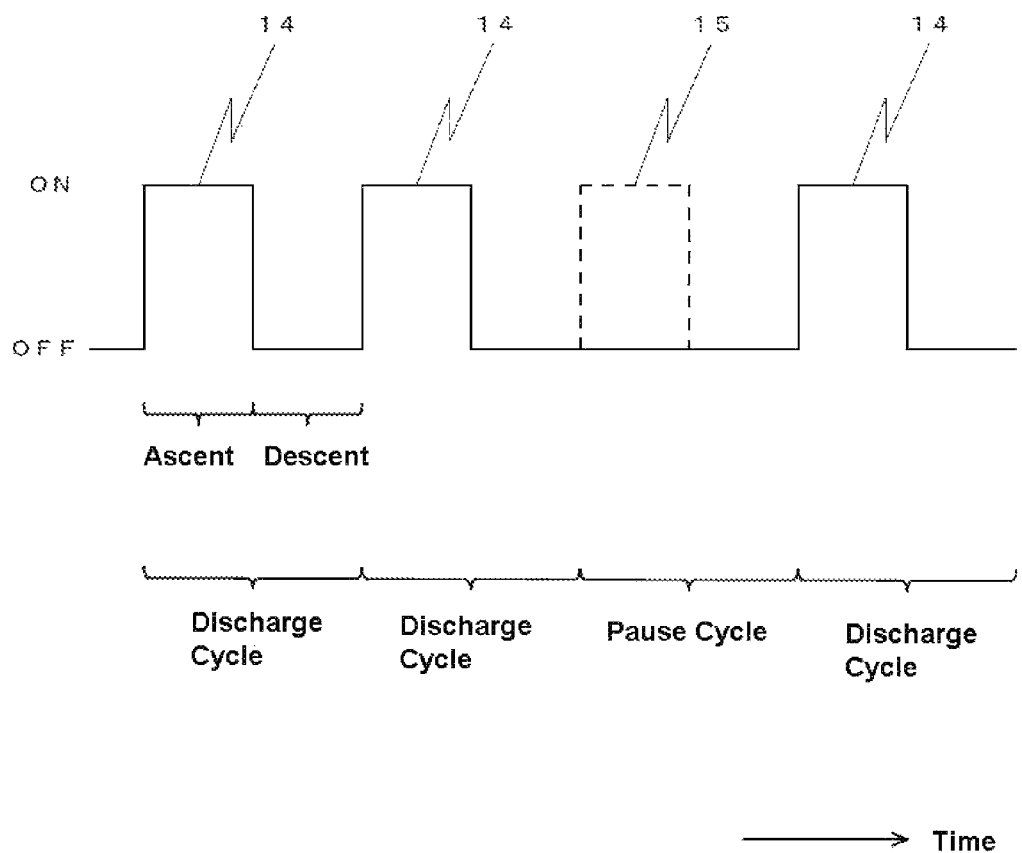
FIG. 3 is a chart to explain pulse signals transmitted to the discharging device according to the embodiment.

The pulse signal is provided, for example, as illustrated in FIG. 3. When the pulse signal is turned on (denoted by a left edge of a pulse 14), the gas is supplied with the operation of the selector valve 6 to ascend the piston 2, thereby opening a nozzle inlet 5. Then, when the pulse signal is turned off (denoted by a right edge of the pulse 14), the gas is exhausted with the operation of the selector valve 6 to descend the piston 2 by a repulsive force of the spring 7, thereby closing the nozzle inlet 5. Thus, one droplet of the liquid material 34 is discharged with the operation of one unit cycle that is formed by the ascent of the piston 2 (i.e., the opening of the nozzle inlet 5) and the descent of the piston 2 (i.e., the closing of the nozzle inlet 5). On the other hand, when the pulse signal is held in an off-state (denoted by 15), the piston 2 is not operated and the nozzle inlet 5 is kept closed during one unit cycle.

An on-state time (ascent time) and an off-state time (descent time) within one unit cycle may be adjusted, or the distance through which the piston 2 is moved may be adjusted by using the stroke adjusting member 8.

When the liquid material 34 is applied along a side of a workpiece 30, the control unit 11 transmits the pulse signal to the discharging device 1 at the preset frequency, while moving the nozzle 4, at the same time as the start of the application, thus continuously discharging the liquid material 34. The liquid material 34 discharged along the side of the workpiece 30 is filled into a gap between the workpiece 30 and the substrate 29 by capillary action.

[Construction of Application Apparatus]

Figure 4:
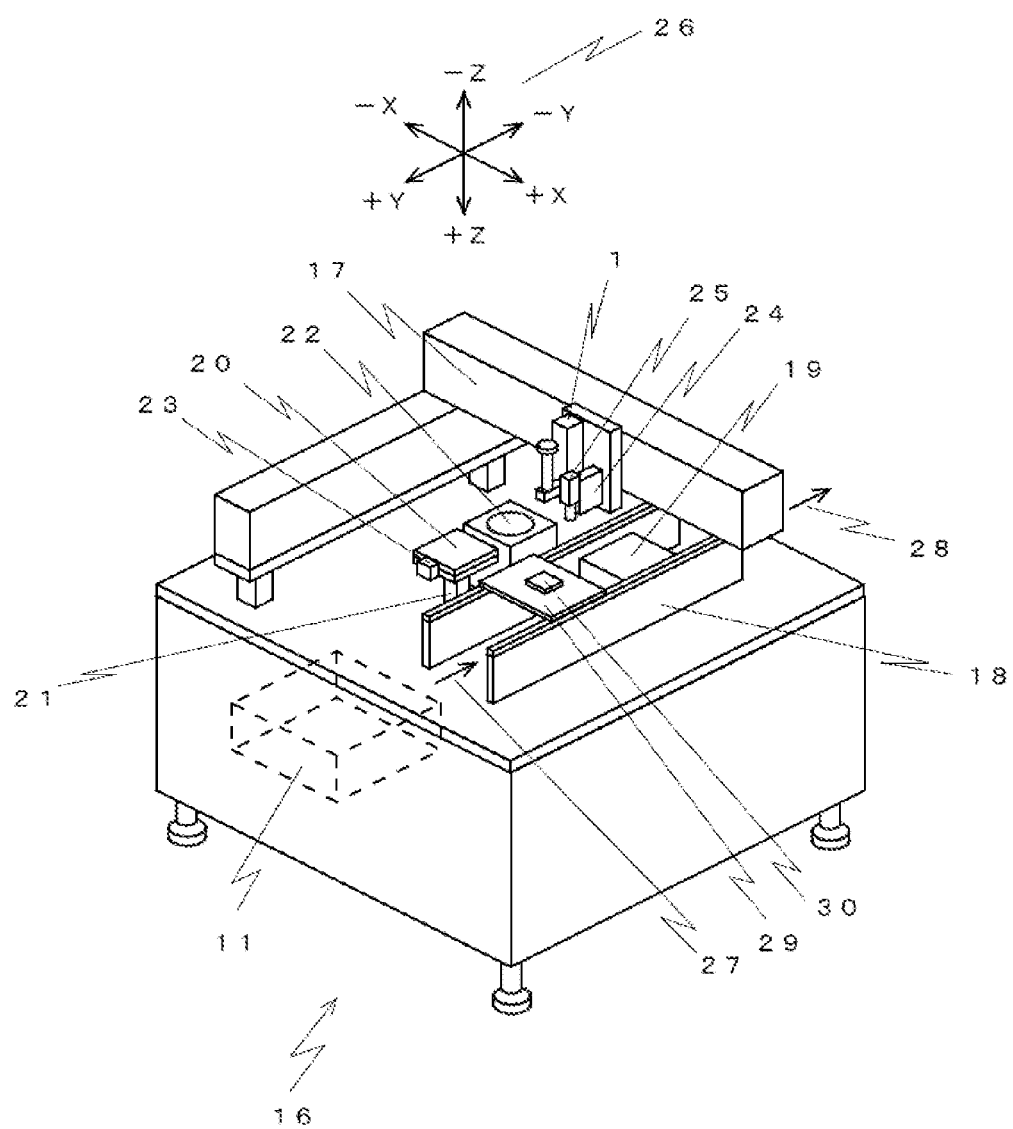
FIG. 4 is a schematic perspective view of an application apparatus according to the embodiment.

An application apparatus 16 according to this embodiment includes, as illustrated in FIG. 4, the discharging device 1, an XYZ driving mechanism 17, a conveying mechanism 18, an application stage 19, an adjustment substrate 20, an adjustment stage 21 on which the adjustment substrate 20 is placed, the weighing gauge 22, a detection device (including a touch sensor 23, a laser displacement gauge 24, and a camera 25), and the control unit 11.

The discharging device 1 is of the jet type discharging device described above, and it discharges the liquid material 34 upon receiving the pulse signal from the control unit 11.

The XYZ driving mechanism 17 mounts thereon not only the discharging device 1, but also the laser displacement gauge 24 and the camera 25, which are part of the detection device described later. Thus, the discharging device 1, the laser displacement gauge 24, and the camera 25 can be moved in the XYZ directions denoted by 26. Stated another way, the discharging device 1 can be moved above the substrate 29 in accordance with the application pattern set in the control unit 11. Further, the discharging device 1, the laser displacement gauge 24, and the camera 25 can be moved to the weighing gauge 22, or to another device, such as the touch sensor 23, which is a part of the later-described detection device fixedly disposed at a different position, or to the adjustment stage 21 on which the later-described adjustment substrate 20 is placed.

The conveying mechanism 18 carries in the substrate 29, which mounts thereon the workpiece 30 before being subjected to application work, from the outside of the application apparatus in a direction denoted by 27, and then conveys the substrate 29 to a position near the discharging device 1 that performs the application work. Further, the conveying mechanism 18 carries out the substrate 29 having been subjected to the application work to the outside of the application apparatus in a direction denoted by 28.

The application stage 19 is installed substantially at a center of the conveying mechanism 18 between two rails of the conveying mechanism 18. When the application work is performed, the application stage 19 is raised and the substrate 29 is fixed in place. When the substrate 29 is conveyed, the application stage 19 is lowered to be out of interference with the conveying of the substrate 29.

The adjustment stage 21 is installed near the conveying mechanism 18. The adjustment stage 21 is used to apply the liquid material for adjusting the supply amount of the liquid material in a state that a bare substrate or a substrate mounting thereon a dummy workpiece (which are collectively called the adjustment substrate 20) is placed on the adjustment stage 21.

The weighing gauge 22 serves to measure the weight of the liquid material 34 discharged from the discharging device 1, and it is installed near the conveying mechanism 18. The result measured by the weighing gauge 22 is sent to the control unit 11.

The detection device includes the touch sensor 23 that is a sensor to detect the height position of the nozzle 4, the laser displacement gauge 24 that is a sensor to detect the height position of the substrate 29, and the camera 25 for detecting the position of the workpiece 30. The laser displacement gauge 24 and the camera 25 are mounted on the XYZ driving mechanism 17 along with the discharging device 1 to be movable in the XYZ directions. The touch sensor 23 is fixedly disposed on the adjustment stage 21.

The control unit 11 includes an overall control unit for controlling the overall operation of the application apparatus 16, and a discharge control unit for controlling the operation of the discharging device 1.

[Application Work]

Figure 5:
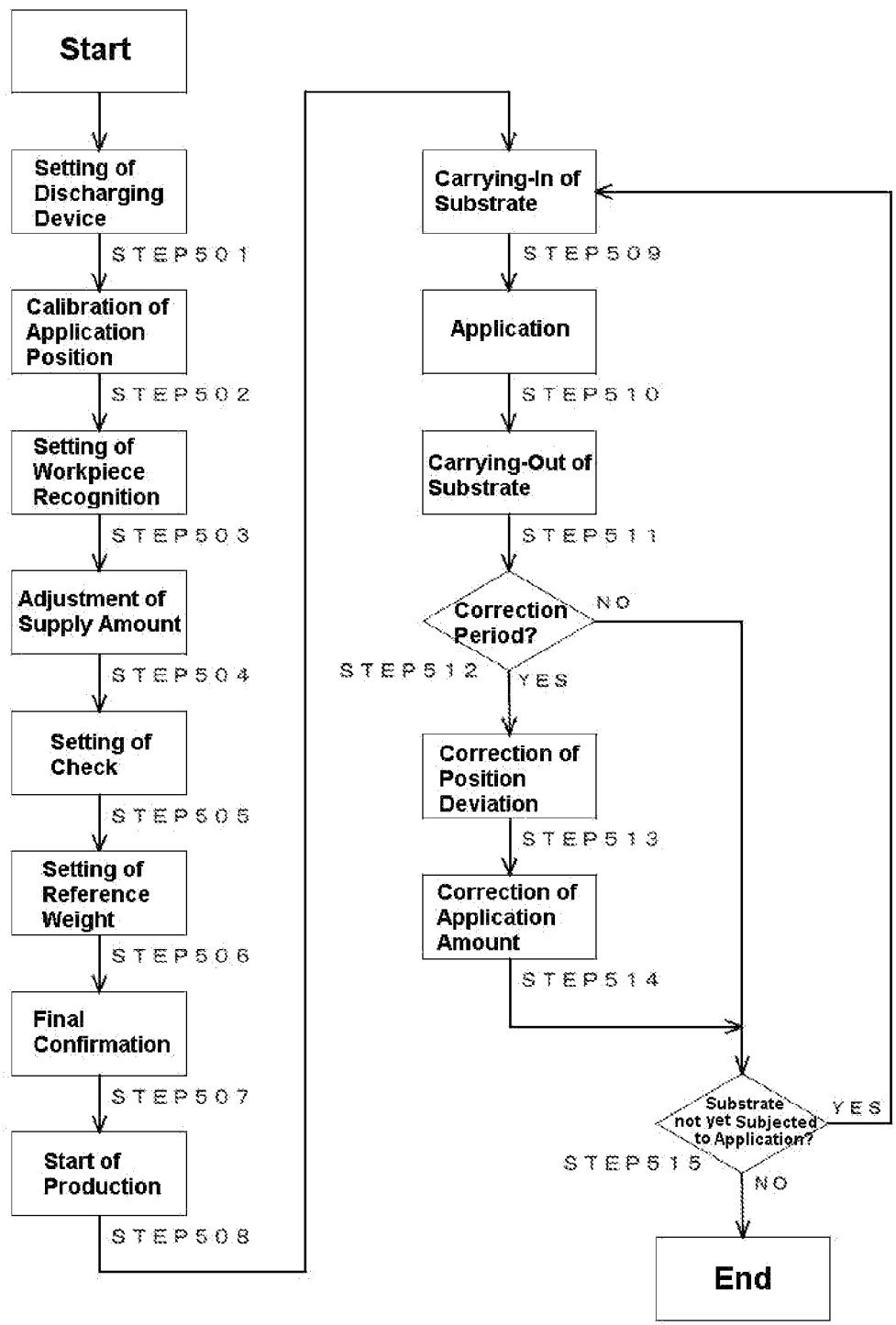
FIG. 5 is a flowchart illustrating procedures for application work performed in the application apparatus according to the embodiment.
Figure 6:
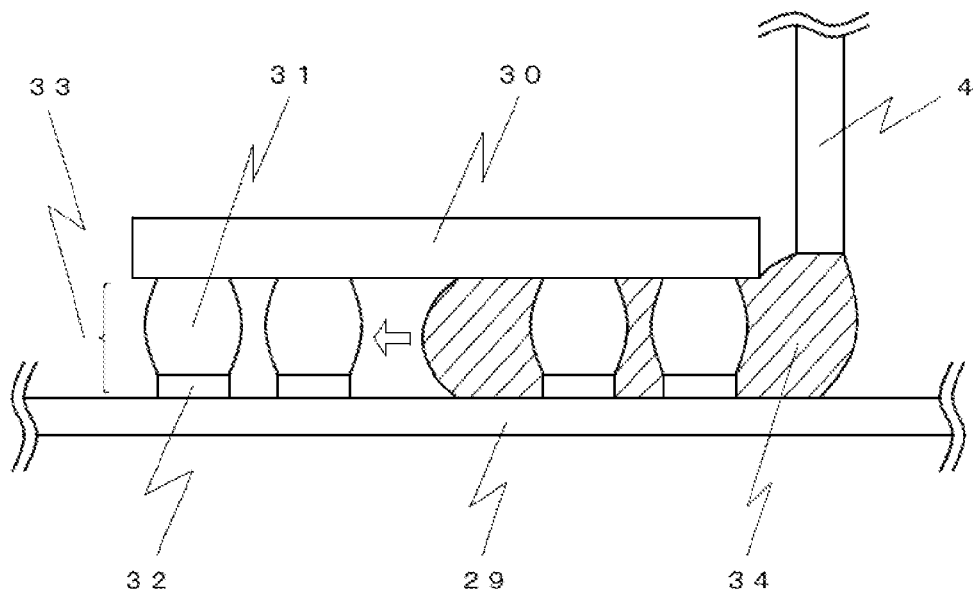
FIG. 6 is a side sectional view to explain an underfilling process.
Figure 7:
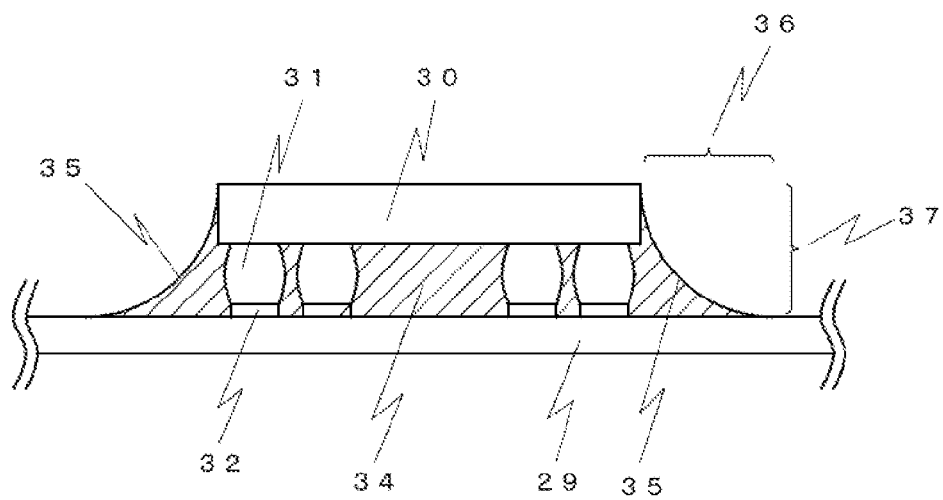
FIG. 7 is a side sectional view to explain a fillet.

A flow of a series of steps for application work using the above-described application apparatus will be described below. FIG. 5 illustrates a flowchart of the application work. The creation of the application pattern will be described later (see FIGS. 14 and 15 described later).

At the start of the application work, the factors (such as the nozzle diameter, the stroke, and the applied pressure) regarding the discharging device are set corresponding to a target discharge amount for each discharge are first set (STEP 501). Such setting operation is preferably performed while the discharge amount for each discharge, the diameter of the applied liquid material, etc. are measured by actually discharging the liquid material. It is also preferable to, at the same time, confirm whether or not the liquid material excessively adheres to a distal end of the nozzle, and whether or not the applied liquid material is scattered and divided into a plurality of parts. Further, the number of discharge pulse and the number of pause pulse are set as the initial parameters (see the above-described Table 1).

Then, a deviation of the application position is calibrated (STEP 502). In this step, the liquid material is first applied linearly on a bare substrate. Thereafter, the camera is moved through the preset distance between the nozzle and the camera and an image of the applied liquid material is taken. Next, a deviation of the taken image of the liquid material from a center of the camera is measured and the measured deviation is adjusted.

Then, setting regarding image recognition of the workpiece as an application target is performed (STEP 503). This setting is used as a basis in performing alignment (i.e., positioning with respect to distortion and/or bending of the workpiece and/or the substrate).

Then, a series of operation steps for adjusting the supply amount of the liquid material from the discharging device, described in the foregoing embodiment, is performed (STEP 504). In other words, the supply amount of the liquid material is adjusted by using one or more of the parameters regarding the discharge singly or in combination, as described above.

Then, positions where the presence or the absence of a fillet, the width of the fillet, etc. are to be checked, and the number of those positions are set (STEP 505). Further, values as references for determining whether good or no good, e.g., a target value and an allowable value, are also set at the same time.

Then, a value used as a reference in correcting the application amount during the subsequent application work is set (STEP 506). In this step, the weight of the liquid material, which has been discharged in a predetermined number of shots or for a predetermined time to the weighing gauge installed in the application apparatus, is measured and the measured weight is stored in the control unit.

Then, final confirmation is made by applying the liquid material to a mounting substrate to which the liquid material is to be actually applied (STEP 507). If no failure is found as a result of the final confirmation, the actual application work is started (STEP 508).

When the actual application work is started, the substrate is first carried in, conveyed to a position near the discharging device, and is fixedly held on the application stage (STEP 509). Then, image recognition of the substrate on the application stage is performed by using the camera, and the alignment is performed for the positioning of the substrate. After the positioning, the liquid material is applied (STEP 510). After the application, the substrate is carried out to the outside of the application apparatus (STEP 511).

At the time when the substrate after the application has been carried out, it is determined whether or not the number of applications reaches a preset correction period (e.g., a preset number of workpieces or substrates) (STEP 512). If the number of applications reaches the correction period, the workflow advances to a correction step described below, and if the number of applications does not reach the correction period, the workflow advances to STEP 515.

The correction step includes correction of the position deviation (STEP 513) and correction of the application amount (STEP 514). In the correction of the position deviation, a similar operation to that in STEP 502 is performed to adjust the position deviation. In the correction of the application amount, the liquid material is first discharged to the weighing gauge for a predetermined time or in a predetermined number of shots, and the weight of the applied liquid material is measured. Then, the measured weight is compared with the reference weight measured in STEP 506 with each other. If the difference exceeds an allowable value, the application amount is corrected by adjusting the discharging device, the application apparatus, etc. such that the allowable value is satisfied with respect to the reference weight. The correction of the application amount can be performed, for example, by one of the following two methods.

(a) Correction Method with Dot-Form Application

The number of times of transmitting the discharge pulse signal and the pause pulse signal is specified as a total pulse number. Of the total pulse number, the number of discharge pulse signals necessary to achieve the application amount is specified and the rest is specified as the number of pause pulse signals. The supply amount of the liquid material is then corrected by adjusting the number of discharge pulse signals and the number of pause pulse signals on the basis of a correction amount calculated at the correction period. On that occasion, the correction is preferably performed by previously storing, in the control unit, a setting table that specifies plural settings in consideration of the discharge amount to be increased or reduced, and by selecting one combination of the discharge pulses and the pause pulses from the setting table.

(b) Correction Method with Line-Form Application

An application pattern made up of a plurality of continuous application regions is created, and a plurality of discharge cycles (i.e., a set of unit cycles), in each of which the number of discharge pulses and the number of pause pulses are combined at a predetermined ratio, are assigned to the respective application regions. The supply amount of the liquid material is then corrected on the basis of the calculation amount calculated at the correction period by adjusting the number of discharge pulses and the number of pause pulses both included in the application pattern, and/or by adjusting the length of at least one of the application regions and the length of other one or two application regions, which are present in continuation with the one application region, without changing the discharge amount per unit time in each application region. On that occasion, the discharge amount is preferably corrected without changing the frequency at which the discharge pulses and the pause pulses are transmitted.

After the end of the correction step or immediately after carrying out the substrate from the apparatus, it is determined whether there remains a substrate not yet subjected to the application, i.e., a substrate to which the liquid material is to be applied successively (STEP 515). If there is a substrate not yet subjected to the application, the workflow returns to STEP 509, followed by carrying in the substrate and performing the application work again. If there is no substrate not yet subjected to the application, the actual application work is brought to an end.

The foregoing is a flow of a series of basic steps from the preparation stage to the actual application work. It is to be noted that the foregoing procedures are merely described as one example and the present invention is not limited to those procedures.

[Examples of Application Pattern]

The discharging device of this Example is adaptable for the application pattern formed by any of the dot-form application and the line-form application.

Figure 14:
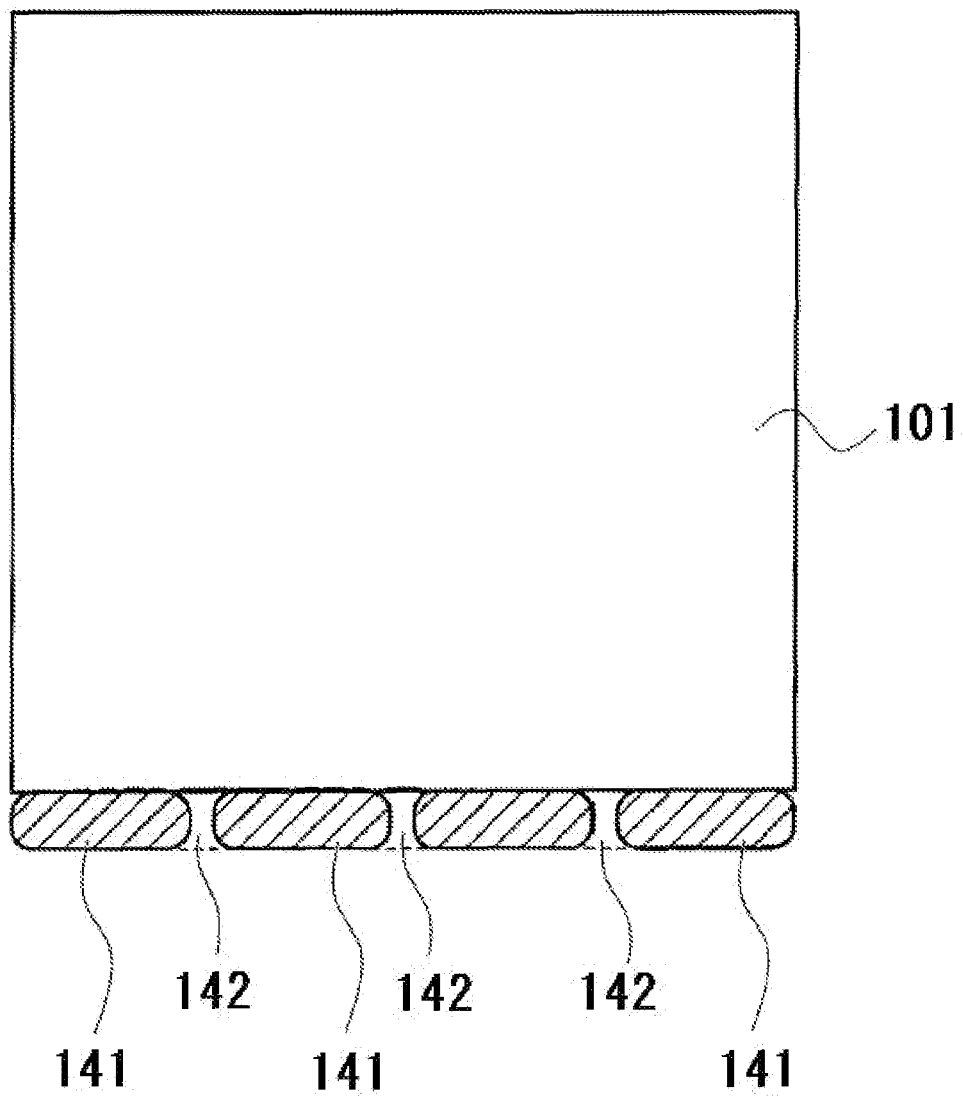
FIG. 14 illustrates an example of an application pattern with a dot-form application.

FIG. 14 illustrates an example of the application pattern with the dot-form application. In FIG. 14, an application region 141 corresponds to the discharge pulse. The discharge amount in the application region 141 is controlled by setting the discharge pulse, whereby the length of the application region 141 is expanded or contracted. Also, the length of a non-application region 142 is expanded or contracted by setting the pause pulse. As methods for calculating the correction amount, there are a method of measuring the weight when the liquid material is discharged for a certain time, and calculating the correction amount on the basis of the difference between the measured weight and the proper weight, and a method of measuring a discharge time required to reach the proper weight, and calculating the correction amount on the basis of the difference between the measured discharge time and the discharge time in a just preceding cycle. Any of those methods can be used.

Figure 15:
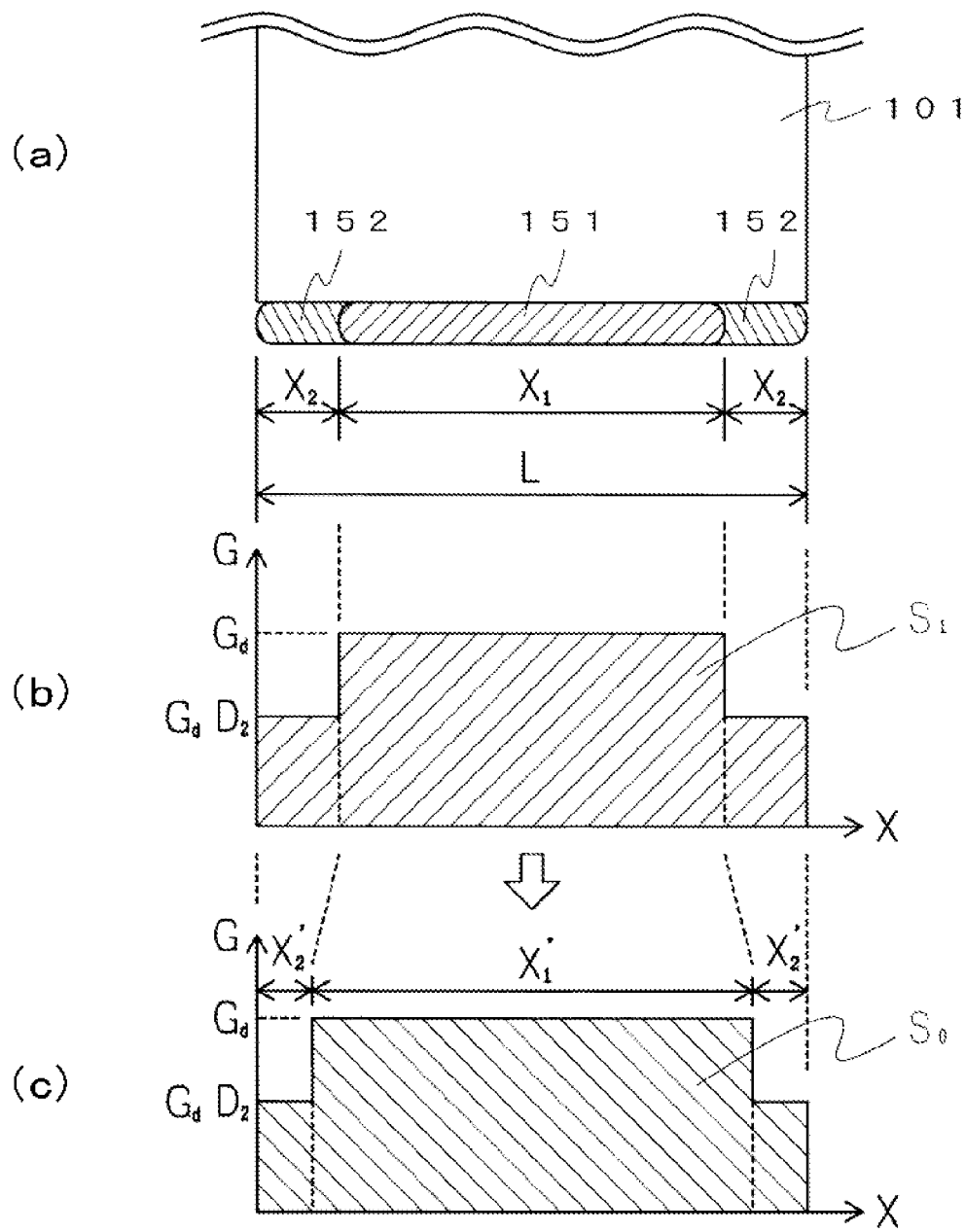
FIG. 15 illustrates an example of an application pattern when, in line-form application, an application region is divided into plural regions and an application amount of the liquid material is changed in each of the divided regions. Specifically.

FIG. 15 illustrates an example of the application pattern when, in the line-form application, an application region is divided into plural regions and the application amount of the liquid material is changed in each of the divided regions. In FIG. 15, one application pattern is formed by preparing a first discharge cycle that includes the discharge pulses and the pause pulses combined at a first ratio and a second discharge cycle including the discharge pulses and the pause pulses combined at a second ratio are prepared, and by connecting, to both ends of one first application region 151 where the liquid material is discharged in accordance with the first discharge cycle, two second application regions 152 and 152 where the liquid material is discharged in accordance with the second discharge cycle, respectively. While both the application regions 152 and 152 correspond to the second discharge cycle in the example of FIG. 15, the present invention is not limited to that example. One of the second application regions 152 may correspond to the second discharge cycle, and the other may correspond to a third discharge cycle. The number of application regions assigned to one discharge cycle can be set to any desired number.

The discharge pulses and the pause pulses are assigned to each application region. In FIG. 15, for example, when it is desired to discharge the liquid material in a larger amount in the first application region 151 than in the second application region 152, the combination of one pause pulse per four discharge pulses (i.e., 80% discharge) and the combination of one pause pulse per three discharge pulses (i.e., 75% discharge) are selected from the setting example A in Table 1 and are set respectively for the first application region 151 and the second application region 152.

In the correction, the number of discharge pulses and the number of pause pulses are adjusted in a similar manner to that described in above (a).

The adjustment of the length of each application region implies a step of adjusting respective lengths of a plurality of different application regions, which constitute the application pattern, where the application amounts per unit length differ from one another. In the case of FIG. 15, when the length of the first application region 151 is prolonged, the application amount is increased, and when it is shortened, the application amount is reduced. On that occasion, the length of each application region is preferably adjusted without changing a total length of the application pattern.

In a graph of FIG. 15(b), an area of a hatched convex portion S1 corresponds to the application amount before the correction. In a graph of FIG. 15(c), an area of a hatched convex portion S0 corresponds to the application amount after the correction. Thus, the application amount can be increased by prolonging a length X1 and shortening a length X2. It is to be noted that even when a deviation is caused in the correction amount with digital correction, which is performed by adjusting the number of pulses, such a deviation in the correction amount can be eliminated by adjusting the length of the application region in an analog manner.

INDUSTRIAL APPLICABILITY

The present invention can be practiced in various type of devices in which the discharged liquid material is departed from a nozzle before coming into contact with an application target. The various types of devices includes, for example, the jet type striking a valve member against a valve seat, thereby causing the liquid material to be discharged in a way flying from the fore end of the nozzle, the plunger jet type moving a plunger-type plunger and then abruptly stopping the plunger, thereby causing the liquid material to be discharged in a way flying from the fore end of the nozzle, and the ink jet type operating in a continuous jet mode or on demand.

It is needless to say that the present invention can be employed in the underfilling process for packaging semiconductors.

| List of Reference Symbols | |
|---|---|
| 1 | discharging device |
| 2 | piston |
| 3 | reservoir |
| 4 | nozzle |
| 5 | nozzle inlet |
| 6 | selector valve |
| 7 | spring |
| 8 | stroke adjusting means |
| 9 | heater |
| 10 | temperature sensor |
| 11 | control unit |
| 12 | gas line |
| 13 | electric line |
| 14 | discharge pulse |
| 15 | pause pulse |
| 16 | application apparatus |
| 17 | XYZ driving mechanism |
| 18 | conveying mechanism |
| 19 | application stage |
| 20 | adjustment substrate |
| 21 | adjustment stage |
| 22 | weighing gauge |
| 23 | touch sensor |
| 24 | laser displacement gauge |
| 25 | camera |
| 26 | nozzle moving direction |
| 27 | carrying-in direction |
| 28 | carrying-out direction |
| 29 | substrate |
| 30 | workpiece (semiconductor chip) |
| 31 | protrusive electrode, bump |
| 32 | electrode pad |
| 33 | connecting portion |
| 34 | resin, liquid material |
| 35 | corner portion, fillet |
| 36 | fillet width |
| 37 | fillet height |
| 38 | area having higher bump density |
| 39 | area having lower bump density |
| 40 | application direction |
| 101 | workpiece (semiconductor chip) |
| 141 | application region |
| 142 | non-application region |
| 151 | first application region |
| 152 | second application region |

The invention claimed is:

1. A liquid material application method comprising the steps of creating a desired application pattern, discharging a liquid material from a nozzle while the nozzle and a workpiece are moved relative to each other, and filling the liquid material into a gap between a substrate and the workpiece by capillary action, the workpiece being placed on the substrate with three or more bumps interposed therebetween, the method further comprising:

an initial parameter setting step of specifying, as a total pulse number, the number of times of transmitting a discharge pulse signal and a pause pulse signal, specifying, of the total pulse number, the number of discharge pulse signals necessary to achieve a required application amount of the liquid material, and specifying the rest as the number of pause pulse signals;

a correction amount calculating step of measuring a discharge amount of the liquid material from a discharging device, and calculating a correction amount of the discharge amount; and a discharge amount correcting step of adjusting the number of discharge pulse signals and the number of pause pulse signals on the basis of the correction amount calculated in the correction amount calculating step, wherein when the bumps are non-uniformly arranged, the number of the discharge pulse signals per unit area is adjusted in the discharge amount correcting step to be larger in an application region adjacent to an area having a higher integration degree of the bumps than in an application region adjacent to an area having a lower integration degree of the bumps.

2. A liquid material application method comprising the steps of discharging a liquid material from a nozzle while the nozzle and a workpiece are moved relative to each other, and filling the liquid material into a gap between a substrate and the workpiece by capillary action, the workpiece being placed on the substrate with three or more bumps interposed therebetween, the method further comprising:
   a step of creating an application pattern made up of a plurality of continuous application regions;
   a discharge cycle assigning step of assigning, to the respective application regions, a plurality of discharge cycles in each of which the number of discharge pulse signals and the number of pause pulse signals are combined at a predetermined ratio;
   a correction amount calculating step of measuring a discharge amount of the liquid material from a discharging device, and calculating a correction amount of the discharge amount; and
   a discharge amount correcting step including a step of adjusting the number of discharge pulse signals and the number of pause pulse signals, both included in the application pattern, and/or a step of adjusting a length of at least one of the application regions and a length of other one or two application regions, which are present in continuation with the one application region, without changing a discharge amount of the liquid material per unit time in each application region, the discharge amount correcting step being performed, when the bumps are non-uniformly arranged, on the basis of the correction amount calculated in the correction amount calculating step such that the supply amount of the liquid material per unit area becomes larger in an application region adjacent to an area having a higher integration degree of the bumps than in an application region adjacent to an area having a lower integration degree of the bumps.

3. The liquid material application method according to claim 1 or 2, wherein the discharge amount is corrected without changing a frequency of transmitting the discharge pulse signals and the pause pulse signals.

4. The liquid material application method according to claim 1 or 2, wherein when the application pattern is an application pattern that does not require direction change of the nozzle, the liquid material is applied without changing a relative moving speed between the nozzle and the workpiece.

5. The liquid material application method according to claim 1 or 2, wherein when the application pattern is an application pattern including an application region that requires direction change of the nozzle, the supply amount of the liquid material per unit area in the application pattern is set such that the liquid material is supplied to an application region not requiring the direction change of the nozzle in a larger amount than to an application region requiring the direction change of the nozzle.

6. A liquid material application apparatus comprising a discharging device provided with a nozzle, a driving mechanism for moving the discharging device and a workpiece relative to each other, a detection device for detecting a shape of the applied liquid material, and a control unit for controlling operations of the aforementioned components,
   wherein the control unit is operated to carry out the liquid material application method according to claim 1 or 2.

7. A computer program product embedded in a computer-readable storage medium for use in an application apparatus comprising a discharging device provided with a nozzle, a driving mechanism for moving the discharging device and a workpiece relative to each other, a detection device for detecting a shape of the applied liquid material, and a control unit for controlling operations of the aforementioned components,
   wherein the program causes the control unit to carry out the liquid material application method according to claim 1 or 2.

8. A liquid material application method comprising the steps of creating a desired application pattern, discharging a liquid material from a nozzle while the nozzle and a workpiece are moved relative to each other, and filling the liquid material into a gap between a substrate and the workpiece by capillary action, the workpiece being placed on the substrate with three or more bumps interposed therebetween, the method further comprising:
   an initial parameter setting step of specifying an interval between unit cycles in each of which the liquid material is discharged once; and
   a correction amount calculating step of measuring a discharge amount of the liquid material from a discharging device, and calculating a correction amount of the discharge amount,
   wherein when the bumps are non-uniformly arranged, the interval between the unit cycles included in the application pattern is adjusted on the basis of the correction amount calculated in the correction amount calculating step such that a supply amount of the liquid material per unit area becomes larger in an application region adjacent to an area having a higher integration degree of the bumps than in an application region adjacent to an area having a lower integration degree of the bumps.

9. The liquid material application method according to claim 8, wherein when the application pattern is an application pattern that does not require direction change of the nozzle, the liquid material is applied without changing a relative moving speed between the nozzle and the workpiece.

10. The liquid material application method according to claim 8 or 9, wherein when the application pattern is an application pattern including an application region that requires direction change of the nozzle, the supply amount of the liquid material per unit area in the application pattern is set such that the liquid material is supplied to an application region not requiring the direction change of the nozzle in a larger amount than to an application region requiring the direction change of the nozzle.

11. A liquid material application apparatus comprising a discharging device provided with a nozzle, a driving mechanism for moving the discharging device and a workpiece relative to each other, a detection device for detecting a shape of the applied liquid material, and a control unit for controlling operations of the aforementioned components,
   wherein the control unit is operated to carry out the liquid material application method according to claim 8 or 9.

12. A computer program product embedded in a computer-readable storage medium for use in an application apparatus comprising a discharging device provided with a nozzle, a driving mechanism for moving the discharging device and a workpiece relative to each other, a detection device for detecting a shape of the applied liquid material, and a control unit for controlling operations of the aforementioned components,
   wherein the program causes the control unit to carry out the liquid material application method according to claim 8 or 9.

* * * * *

UNITED STATES PATENT AND TRADEMARK OFFICE
CERTIFICATE OF CORRECTION

PATENT NO.         : 8,703,601 B2
APPLICATION NO.    : 13/389895
DATED              : April 22, 2014
INVENTOR(S)        : Kazumasa Ikushima Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 178 days.

Signed and Sealed this

Twenty-ninth Day of September, 2015

Michelle K. Lee
*Director of the United States Patent and Trademark Office*